(12) United States Patent
Hashimoto

(10) Patent No.: US 11,557,702 B2
(45) Date of Patent: Jan. 17, 2023

(54) LIGHT-EMITTING DEVICE AND METHOD FOR MANUFACTURING SAME

(71) Applicant: NICHIA CORPORATION, Anan (JP)

(72) Inventor: Toru Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 148 days.

(21) Appl. No.: 16/913,033

(22) Filed: Jun. 26, 2020

(65) Prior Publication Data

US 2021/0005795 A1    Jan. 7, 2021

(30) Foreign Application Priority Data

Jul. 2, 2019   (JP) .............................. JP2019-123662

(51) Int. Cl.
| | | |
|---|---|---|
| *H01L 33/00* | (2010.01) | |
| *H01L 33/56* | (2010.01) | |
| *H01L 33/64* | (2010.01) | |
| *H01L 33/54* | (2010.01) | |

(52) U.S. Cl.
CPC ............ *H01L 33/56* (2013.01); *H01L 33/005* (2013.01); *H01L 33/54* (2013.01); *H01L 33/641* (2013.01)

(58) Field of Classification Search
CPC .................................................. H01L 33/005
USPC ......................................................... 438/27
See application file for complete search history.

(56) References Cited

U.S. PATENT DOCUMENTS

| | | | |
|---|---|---|---|
| 2007/0221711 A1* | 9/2007 | Wada .................... | H05K 3/3485 |
| | | | 228/248.1 |
| 2015/0263254 A1 | 9/2015 | Miyoshi et al. | |
| 2017/0033267 A1 | 2/2017 | Tamaki et al. | |
| 2017/0062681 A1 | 3/2017 | Miyoshi et al. | |
| 2017/0186925 A1 | 6/2017 | Nakabayashi | |
| 2017/0294561 A1 | 10/2017 | Ikeda et al. | |
| 2017/0294563 A1 | 10/2017 | Hashimoto | |
| 2018/0058641 A1* | 3/2018 | Takehara ............ | H01L 25/0753 |
| 2018/0175239 A1 | 6/2018 | Hayashi | |
| 2018/0212128 A1 | 7/2018 | Hayashi | |
| 2018/0269361 A1 | 9/2018 | Hayashi | |
| 2018/0269363 A1 | 9/2018 | Iwakiri et al. | |
| 2018/0287019 A1 | 10/2018 | Hashimoto et al. | |
| 2019/0067535 A1 | 2/2019 | Ozeki | |
| 2019/0081202 A1 | 3/2019 | Kasai | |
| 2019/0165218 A1 | 5/2019 | Nakai et al. | |

FOREIGN PATENT DOCUMENTS

| | | |
|---|---|---|
| JP | 2006-319053 A | 11/2006 |
| JP | 2015-188069 A | 10/2015 |
| JP | 2017-033967 A | 2/2017 |

(Continued)

*Primary Examiner* — Hsin Yi Hsieh
(74) *Attorney, Agent, or Firm* — Squire Patton Boggs (US) LLP

(57) ABSTRACT

A method for manufacturing a light-emitting device includes providing a transparent member having a protrusion formed at an upper surface of the transparent member. A first resin portion is placed on the protrusion in which the first resin portion has a solid form and is made from a first resin material of which the viscosity decreases when heated. A light-emitting element is placed on the first resin portion, the light-emitting element is caused to be self-aligned with respect to the protrusion by reducing a viscosity of the first resin portion by heating to a first temperature. The first resin portion is solidified by cooling.

3 Claims, 13 Drawing Sheets

(56) References Cited

FOREIGN PATENT DOCUMENTS

| | | | |
|---|---|---|---|
| JP | 2017-050359 | A | 3/2017 |
| JP | 2017-117973 | A | 6/2017 |
| JP | 2017-188592 | A | 10/2017 |
| JP | 2017-188593 | A | 10/2017 |
| JP | 2017-228658 | A | 12/2017 |
| JP | 2018-120923 | A | 8/2018 |
| JP | 2018-139285 | A | 9/2018 |
| JP | 2018-155968 | A | 10/2018 |
| JP | 2018-157045 | A | 10/2018 |
| JP | 2018-174251 | A | 11/2018 |
| JP | 2018-191015 | A | 11/2018 |
| JP | 2019-040895 | A | 3/2019 |
| JP | 2019-054073 | A | 4/2019 |
| JP | 2019-057627 | A | 4/2019 |
| JP | 2019-102614 | A | 6/2019 |

\* cited by examiner

T=T0

LIGHT-EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2019-123662, filed on Jul. 2, 2019, the entire contents of which are incorporated herein by reference.

FIELD

Embodiments relate to a light-emitting device and a method for manufacturing the same.

BACKGROUND

There is a light-emitting device in which a light-emitting element and a transparent member such as a fluorescer layer or the like are bonded using a bonding agent. It is difficult to align the light-emitting element and the transparent member as the light-emitting device is downscaled.

SUMMARY

A method for manufacturing a light-emitting device according to an embodiment of the invention includes providing a transparent member having a protrusion formed at an upper surface of the transparent member A first resin portion is placed on the protrusion in which the first resin portion has a solid form and is made from a first resin material of which the viscosity decreases when heated. A light-emitting element is placed on the first resin portion, and the light-emitting element is caused to be self-aligned with respect to the protrusion by reducing a viscosity of the first resin portion by heating to a first temperature. The first resin portion is solidified by cooling.

A method for manufacturing a light-emitting device according to another embodiment of the invention includes providing a light-emitting element, and placing a first resin portion on the light-emitting element in which the first resin portion has a solid form and is made from a first resin material of which the viscosity decreases when heated. A transparent member is placed on the first resin portion, and the transparent member is caused to be self-aligned with respect to the light-emitting element by reducing a viscosity of the first resin portion by heating to a first temperature. The first resin portion is solidified by cooling.

A light-emitting device according to an embodiment of the invention includes a light-emitting element, a transparent member provided on the light-emitting element, a light guide member provided between the light-emitting element and the transparent member, and a cover member covering at least a portion of a side surface of a stacked body. The light guide member covers an upper surface of the light-emitting element, a side surface of the light-emitting element, and a lower surface of the transparent member, and includes a second resin material which is thermosettable and a first resin material of which the viscosity decreases when heated. The stacked body includes the light-emitting element, the light guide member, and the transparent member.

DETAILED DESCRIPTION

Embodiments of the invention will now be described. As a general rule in the following description of embodiments other than the first embodiment, only the differences with respect to the first embodiment are described; otherwise, the configuration and the effects are similar to those of the first embodiment. The drawings used in the description are schematic and are simplified as appropriate.

First Embodiment

FIG. 1A to FIG. 2C are cross-sectional views showing a method for manufacturing a light-emitting device according to the embodiment.

Figure 3:
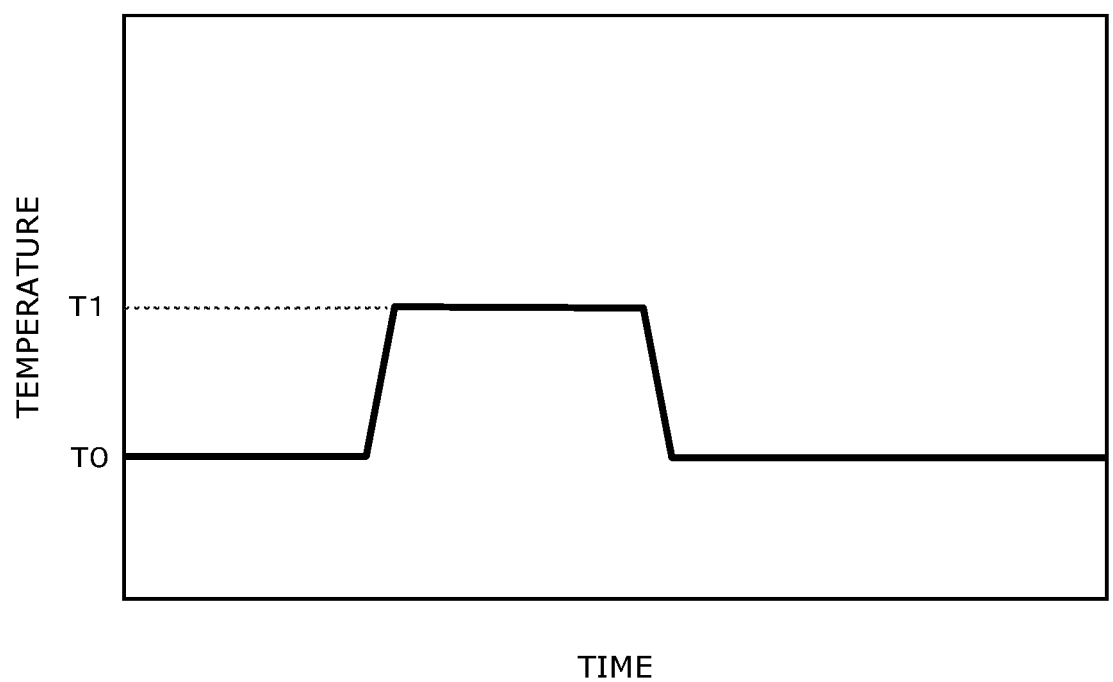
FIG. 3 is a graph showing a temperature profile of the method for manufacturing the light-emitting device according to the first embodiment, in which the horizontal axis is time, and the vertical axis is the temperature.

FIG. 3 is a graph showing a temperature profile of the method for manufacturing the light-emitting device according to the embodiment, in which the horizontal axis is time, and the vertical axis is the temperature.

Figure 1A:
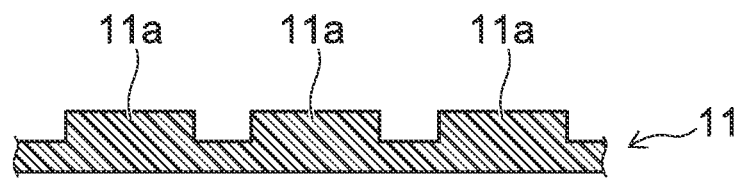
FIG. 1A is a cross-sectional view showing a method for manufacturing a light-emitting device according to a first embodiment.

First, a transparent member 11 is provided as shown in FIG. 1A. The transparent member 11 is, for example, a fluorescer layer in which many fluorescer particles are dispersed in a main material made of a transparent resin material. The transparent member 11 may be a transparent layer not including fluorescer particles. Multiple protrusions 11a are formed at the upper surface of the transparent member 11. When viewed in top-view, the protrusion 11a has a configuration, e.g., a rectangular configuration similar to the configuration of a light-emitting element 13 described below. The transparent member 11 may be provided by manufacturing or by procuring.

The method for forming the multiple protrusions 11a includes, for example, providing a flat-plate shaped transparent sheet and forming non-through cutting trenches in the row direction and/or the column direction by using a cutting device for dicing, etc. The regions that are surrounded with the cutting trenches are used as the protrusions 11a. The separation distance between adjacent protrusions 11a is, for example, 20 μm to 100 μm, and favorably 40 μm to 80 μm. The height of the protrusion 11a is, for example, 50 μm to 300 μm, and favorably 100 μm to 250 μm.

Figure 1B:
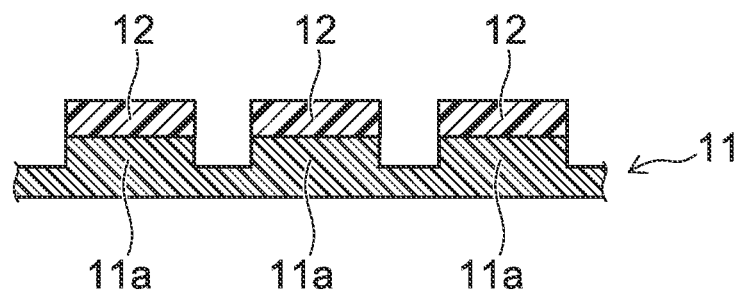
FIG. 1B is a cross-sectional view showing the method for manufacturing the light-emitting device according to the first embodiment.

Then, as shown in FIG. 1B, a solid first resin portion 12 is placed on the protrusions 11a of the transparent member 11. "Solid" also includes gels. The first resin portion 12 is made of a first resin material of which the viscosity decreases when heated. The first resin material is, for example, plastic. In an example in which the first resin material is plastic, the first resin material is an acrylic resin. The first resin material may be thermosettable. In an example in which the first resin material is thermosettable, the first resin material is a hybrid resin of a silicone resin and an epoxy resin.

Before placing the solid first resin portion 12 on the protrusions 11a of the transparent member 11, processing, such as heat treatment, can be performed to increase the viscosity of the first resin portion 12. For example, the first resin portion 12 is maintained at a temperature of 100 to 120° C. for 5 to 10 minutes. Unintended movement of the first resin portion 12 during or after the placement of the first resin portion 12 on the protrusions 11a of the transparent member 11 can be suppressed thereby. Although there are also cases where the surface of the first resin portion 12 or the entire first resin portion 12 is in a semi-molten state at this time, the configuration of the first resin portion 12 is maintained as an entirety. In the specification, such a case also is included in "solid".

Figure 1C:
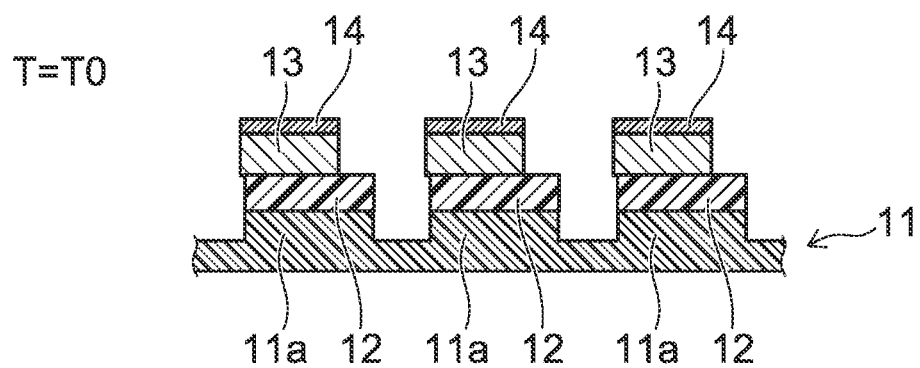
FIG. 1C is a cross-sectional view showing the method for manufacturing the light-emitting device according to the first embodiment.

Then, as shown in FIG. 1C, the light-emitting elements 13 are placed on the first resin portions 12. Specifically, the light-emitting elements 13 are placed one at a time on the protrusions 11a of the transparent member 11 with the first resin portions 12 interposed. When viewed in top-view, the light-emitting element 13 has a configuration, e.g., a rectangular chip configuration similar to the configuration of the protrusion 11a. The light-emitting element 13 is, for example, a light-emitting diode (LED). A pair of electrodes 14 is formed at the upper surface of the light-emitting element 13. In FIG. 1C, the pair of electrodes 14 is arranged in the depth direction of the page surface, and only one electrode 14 is illustrated for each light-emitting element 13. This is similar for the drawings hereinafter as well.

When placing the light-emitting element 13 on the first resin portion 12, when viewed in top-view, the position and the orientation of the light-emitting element 13 may be such that the geometric center of the light-emitting element 13 and the geometric center of the protrusion 11a overlap and the respective edges of the light-emitting element 13 and the respective edges of the protrusion 11a are parallel to each other, or the position and the orientation of the light-emitting element 13 may be shifted from the position and the orientation of the protrusion 11a. For example, when viewed in top-view, the center of the light-emitting element 13 may be shifted from the center of the protrusion 11a, and the edges of the light-emitting element 13 may be oblique to the edges of the protrusion 11a.

Figure 2A:
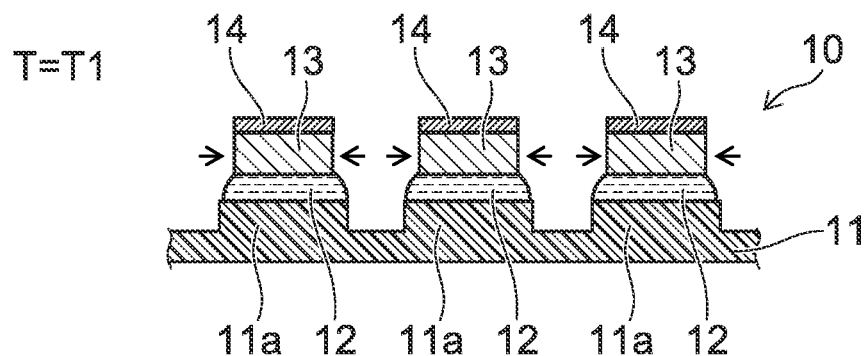
FIG. 2A is a cross-sectional view showing the method for manufacturing the light-emitting device according to the first embodiment.

Continuing as shown in FIG. 2A and FIG. 3, the viscosity of the first resin portion 12 is reduced by heating a structure body 10 made of the transparent member 11, the first resin portion 12, and the light-emitting element 13 from a reference temperature T0 to a first temperature T1. The reference temperature T0 is, for example, the temperature when placing the light-emitting elements 13 shown in FIG. 1C, e.g., room temperature. The first temperature T1 is a temperature at which the viscosity of the first resin material of the first resin portion 12 decreases. For example, when the first resin material is an acrylic resin, the first temperature T1 is not less than 80° C. and not more than 100° C. When a thermosetting resin is used as the first resin material, the first temperature T1 is in a low-viscosity range in which the viscosity decreases gradually as the temperature increases. The first temperature T1 is less than the flexion point at which the curing effect abruptly occurs.

Thereby, the fluidity of the first resin portion 12 increases, and self-alignment of the light-emitting element 13 with respect to the protrusion 11a of the transparent member 11 occurs. As a result, the position and the orientation of the light-emitting element 13 substantially match the position and the orientation of the protrusion 11a when viewed in top-view. In other words, when viewed in top-view, the center of the light-emitting element 13 substantially matches the center of the protrusion 11a, and the edges of the light-emitting element 13 are substantially parallel to the edges of the protrusion 11a.

Figure 2B:
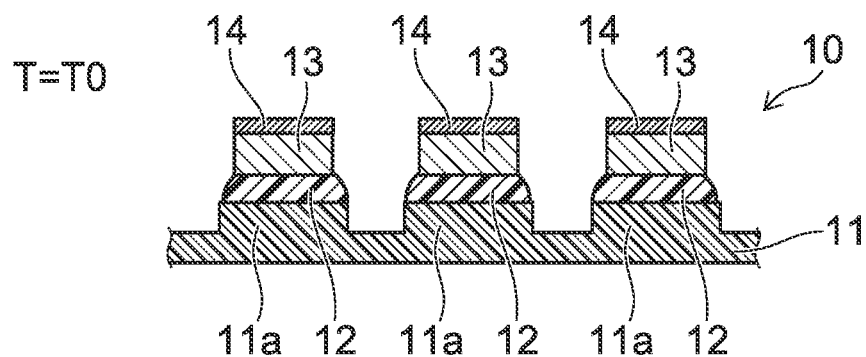
FIG. 2B is a cross-sectional view showing the method for manufacturing the light-emitting device according to the first embodiment.

Then, as shown in FIG. 2B and FIG. 3, the structure body 10 is cooled from the first temperature T1 to the reference temperature T0. The first resin portion 12 is solidified thereby. As a result, the light-emitting element 13 is bonded to the transparent member 11 by the first resin portion 12.

Figure 2C:
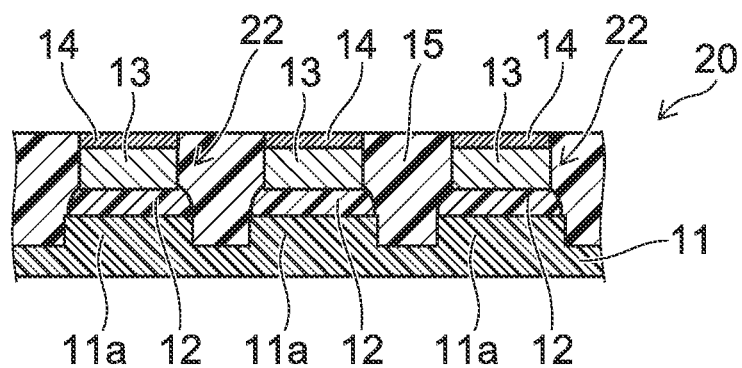
FIG. 2C is a cross-sectional view showing the method for manufacturing the light-emitting device according to the first embodiment.

Continuing as shown in FIG. 2C, a cover member 15 is formed on the transparent member 11. The cover member 15 covers the side surface of a stacked body 22 made of the protrusion 11a of the transparent member 11, the first resin portion 12, the light-emitting element 13, and the electrodes 14. For example, the cover member 15 is formed of a white resin material. A structure body 20 includes the transparent member 11, the first resin portion 12, the light-emitting element 13, the electrodes 14, and the cover member 15. Then, the portion of the transparent member 11 other than the protrusions 11a is removed from the lower surface side toward the upper surface side of the structure body 20. The lower portions of the protrusions 11a also may be removed at this time. Then, for example, the structure body 20 is singulated for each light-emitting element 13. Thus, the light-emitting device according to the embodiment is manufactured.

In some embodiments, the first resin portion 12 can be thick because the first resin portion 12 is a solid when placing the first resin portion 12 on the protrusion 11a of the transparent member 11 in the process shown in FIG. 1B.

Then, in the process shown in FIG. 2A, the viscosity of the first resin portion 12 is reduced by heating the first resin portion 12 to the first temperature T1. Thereby, self-alignment of the light-emitting element 13 with respect to the protrusion 11a occurs, and the position and the orientation of the light-emitting element 13 substantially match the position and the orientation of the protrusion 11a when viewed in top-view. As a result, the shape precision of the light-emitting device increases. In other words, in the process shown in FIG. 1C, the position and the orientation of the light-emitting element 13 may not strictly match the position and the orientation of the protrusion 11a of the transparent member 11. Therefore, the process of placing the light-emitting element 13 on the first resin portion 12 is easy.

Second Embodiment

FIG. 4A to FIG. 5C are cross-sectional views showing a method for manufacturing a light-emitting device according to another embodiment.

Figure 6:
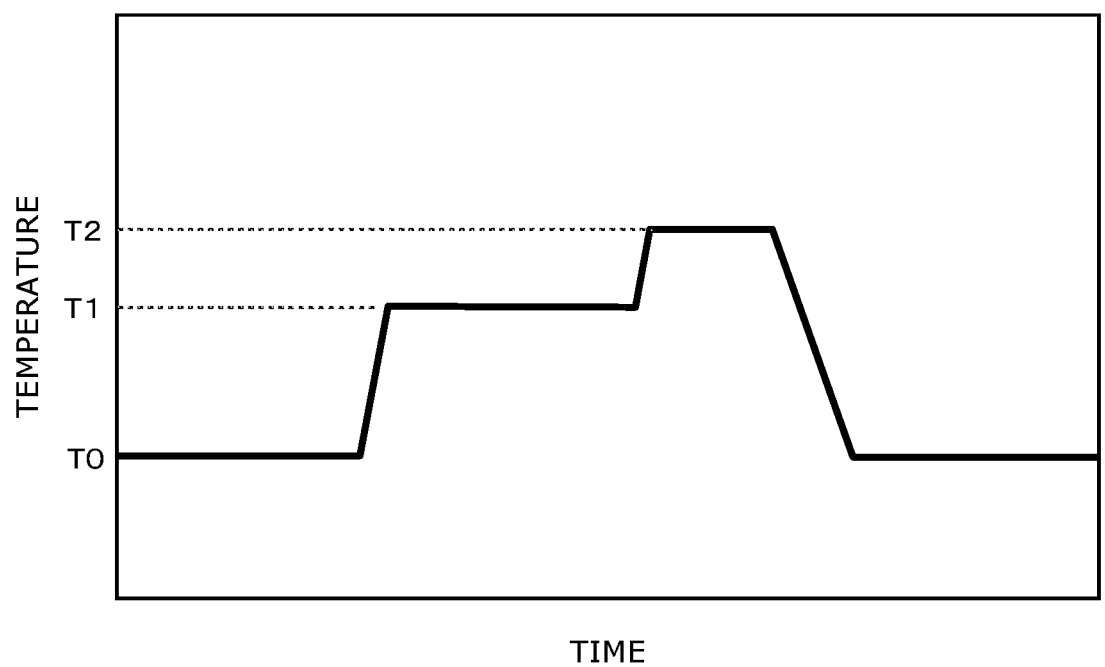
FIG. 6 is a graph showing a temperature profile of the method for manufacturing the light-emitting device according to the second embodiment, in which the horizontal axis is time, and the vertical axis is the temperature.

FIG. 6 is a graph showing a temperature profile of the method for manufacturing the light-emitting device according to the embodiment, in which the horizontal axis is time, and the vertical axis is the temperature.

First, the processes shown in FIG. 1A and FIG. 1B are performed.

Figure 4A:
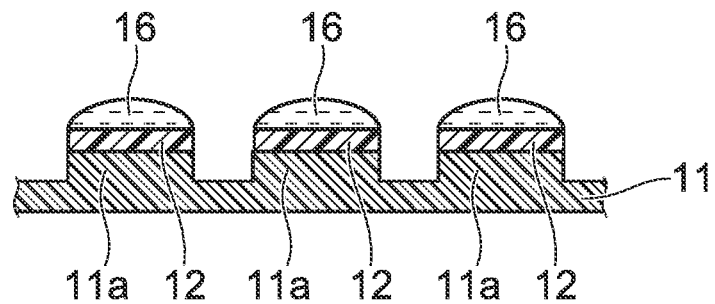
FIG. 4A is a cross-sectional view showing a method for manufacturing a light-emitting device according to a second embodiment.

Then, as shown in FIG. 4A, a liquid second resin portion 16 is placed on the solid first resin portion 12. "Liquid" also includes sols. The second resin portion 16 is made of a thermosettable second resin material. In an example, the second resin material is a silicone resin or an epoxy resin. The thickness of the first resin portion 12 is, for example, not less than 10 μm and not more than 40 μm, and favorably not less than 20 μm and not more than 30 μm. The self-alignment capability is good when the thickness of the first resin portion 12 is set in the numerical range recited above. The thickness of the second resin portion 16 is, for example, not less than 0.1 μm and not more than 10 m, and favorably not less than 0.5 μm and not more than 5 μm. The light-emitting element 13 can be mounted stably by setting the thickness of the second resin portion 16 in the numerical range recited above.

Figure 4B:
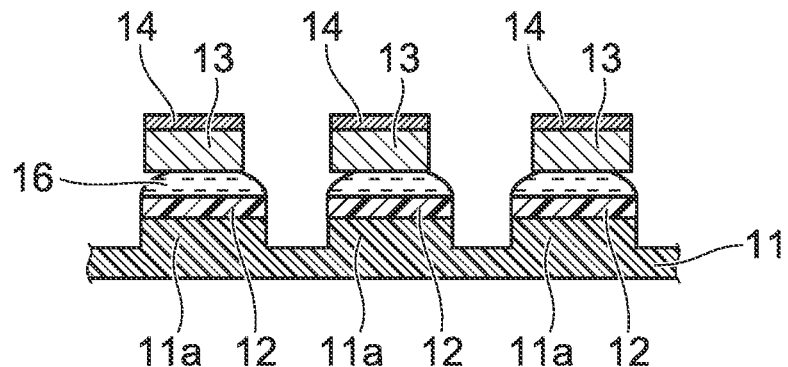
FIG. 4B is a cross-sectional view showing the method for manufacturing the light-emitting device according to the second embodiment.

Continuing as shown in FIG. 4B, the light-emitting elements 13 are placed on the second resin portions 16. Specifically, the light-emitting elements 13 are placed one at a time on the protrusions 11a of the transparent member 11 with the solid first resin portions 12 and the liquid second resin portions 16 interposed. When placing the light-emitting element 13 on the second resin portion 16, when viewed in top-view, the position and the orientation of the light-emitting element 13 may be the same as the position and the orientation of the protrusion 11a or may be shifted from the position and the orientation of the protrusion 11a.

Figure 4C:
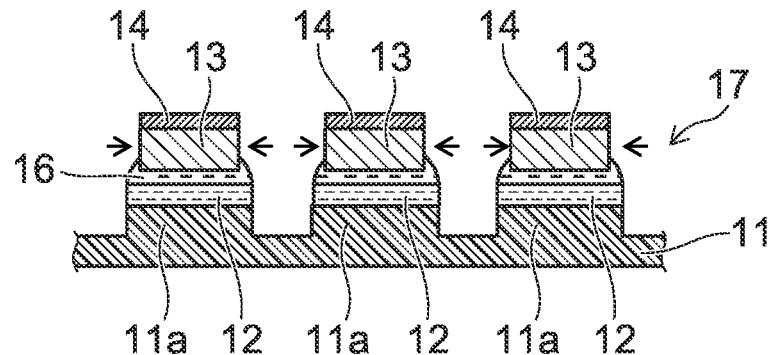
FIG. 4C is a cross-sectional view showing the method for manufacturing the light-emitting device according to the second embodiment.

Then, as shown in FIG. 4C and FIG. 6, the viscosity of the first resin portion 12 is reduced by heating a structure body 17 made of the transparent member 11, the first resin portion 12, the second resin portion 16, and the light-emitting element 13 from the reference temperature T0 to the first temperature T1. As described above, the first temperature T1 is a temperature at which the viscosity of the first resin material of the first resin portion 12 decreases. In an example, similarly to the first embodiment, the first resin material may be an acrylic resin. In such a case, the first temperature T1 is not less than 80° C. and not more than 100° C.

Thereby, the fluidity of the first resin portion 12 increases, and the first resin portion 12 becomes a large fluidic body with the liquid second resin portion 16. Therefore, self-alignment of the light-emitting element 13 with respect to the protrusion 11a of the transparent member 11 occurs. As a result, the position and the orientation of the light-emitting element 13 substantially match the position and the orientation of the protrusion 11a when viewed in top-view. In other words, when viewed in top-view, the center of the light-emitting element 13 substantially matches the center of the protrusion 11a, and the edges of the light-emitting element 13 are substantially parallel to the edges of the protrusion 11a.

Figure 5A:
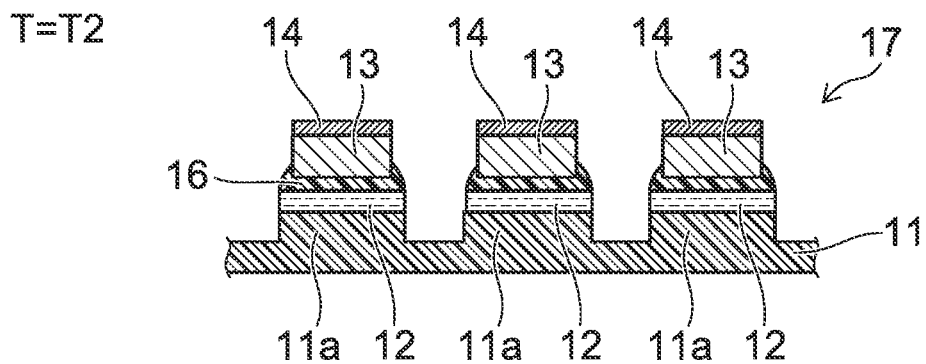
FIG. 5A is a cross-sectional view showing the method for manufacturing the light-emitting device according to the second embodiment.

Then, as shown in FIG. 5A and FIG. 6, the structure body 17 is heated to a second temperature T2 higher than the first temperature T1. The second temperature T2 is a temperature at which the second resin material is cured. For example, when the second resin material is a silicone resin or an epoxy resin, the second temperature T2 is one hundred and several tens of degrees C. The second resin portion 16 is cured thereby.

If both the first resin material and the second resin material are thermosettable, the first resin material and the second resin material may be selected to satisfy the following conditions. The first resin material and the second resin material are selected from resin materials satisfying T1<T3<T2<T4, wherein the temperature at which the viscosity of the first resin material decreases is T1 (the first temperature), the temperature at which the viscosity of the second resin material decreases is T3, the temperature at which the first resin material starts to solidify is T4, and the temperature at which the second resin material starts to solidify is T2 (the second temperature). Thereby, in the heating process of the first resin material and the second resin material, the state in which both are liquids easily can be set to be between the temperature T3 and the temperature T2. Thereby, the self-alignment with respect to the light-emitting element 13 occurs more effectively.

Figure 5B:
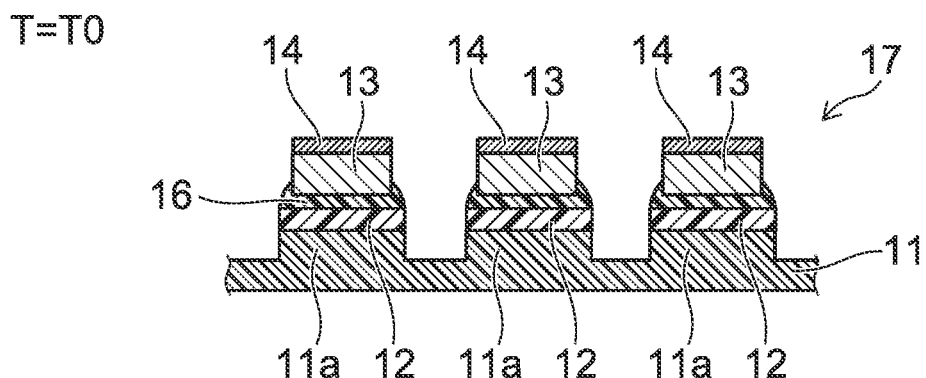
FIG. 5B is a cross-sectional view showing the method for manufacturing the light-emitting device according to the second embodiment.

Then, as shown in FIG. 5B and FIG. 6, the structure body 17 is cooled from the second temperature T2 to the reference temperature T0. The first resin portion 12 is solidified thereby. As a result, the light-emitting element 13 is bonded to the transparent member 11 by the first resin portion 12 and the second resin portion 16.

Figure 5C:
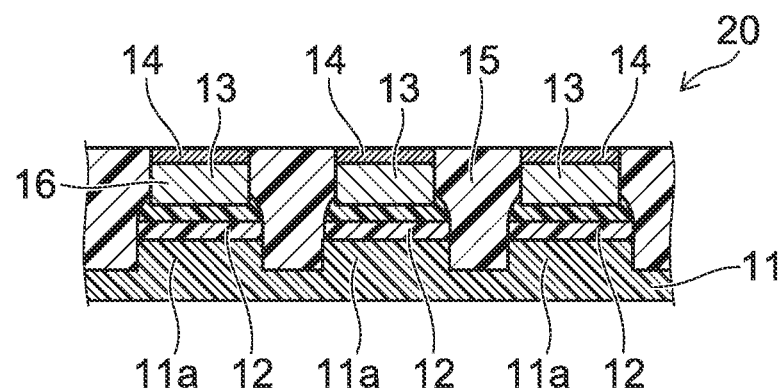
FIG. 5C is a cross-sectional view showing the method for manufacturing the light-emitting device according to the second embodiment.

The processes thereafter are similar to those of the first embodiment. Namely, as shown in FIG. 5C, the cover member 15 is formed on the transparent member 11. The structure body 20 is made thereby. Then, the portion of the transparent member 11 other than the protrusions 11a is removed from the structure body 20. Then, for example, the structure body 20 is singulated for each light-emitting element 13. Thus, the light-emitting device according to the embodiment is manufactured.

Figure 7:
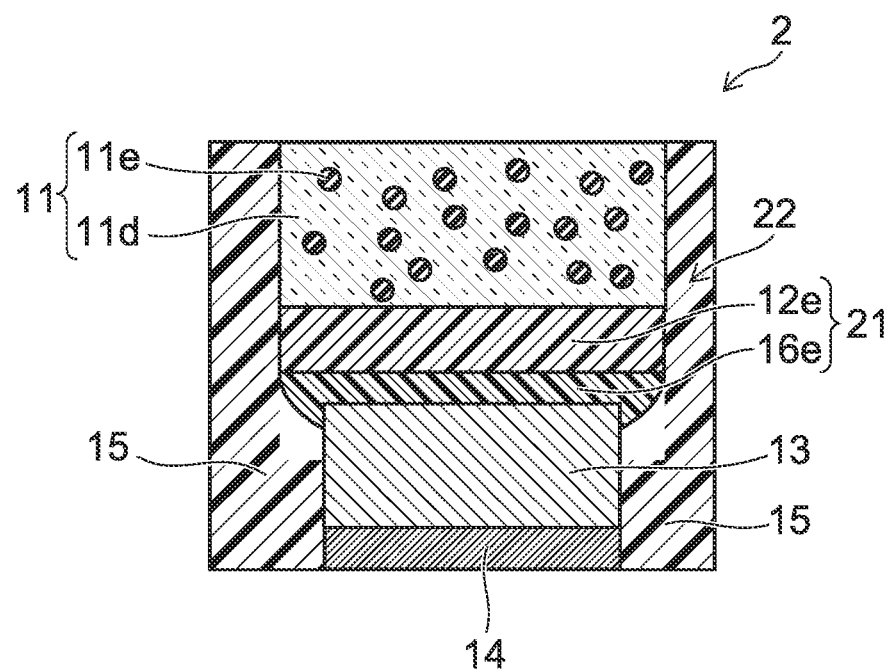
FIG. 7 is a cross-sectional view showing the light-emitting device according to the second embodiment.

FIG. 7 is a cross-sectional view showing a light-emitting device according to the embodiment.

Up and down in FIG. 4A to FIG. 5C are reversed in FIG. 7. Although the direction from the light-emitting element 13 toward the transparent member 11 is taken as "up" and the reverse direction is taken as "down" in the description of FIG. 7, these expressions are for convenience and are independent of the direction of gravity. This is because the direction of gravity is not important in the light-emitting device after manufacturing because all of the portions are solidified. Conversely, the expressions of "up" and "down" in the description of FIG. 4A to FIG. 5C refer to the direction of gravity. This is because the direction of gravity is important in the method for manufacturing the light-emitting device shown in FIG. 4A to FIG. 5C because there is a period in which the first resin portion 12 and the second resin portion 16 are in low-viscosity states or liquid forms, or there is a process of placing the light-emitting element 13.

As shown in FIG. 7, the pair of electrodes 14, the light-emitting element 13, the transparent member 11 provided on the light-emitting element 13, a light guide member 21, and the cover member 15 are provided in the light-emitting device 2 according to some embodiments. The pair of electrodes 14 is connected to the light-emitting element 13. The light guide member 21 is provided between the light-emitting element 13 and the transparent member 11 and covers the upper surface of the light-emitting element 13, the side surface of the light-emitting element 13, and the lower surface of the transparent member 11. The light guide member 21 includes the first resin material and the second resin material and is, for example, transparent. The cover member 15 covers at least a portion of the side surface of the stacked body 22 including the pair of electrodes 14, the light-emitting element 13, the light guide member 21, and the transparent member 11.

A first layer 12e in which the concentration of the first resin material is greater than the concentration of the second resin material and a second layer 16e in which the concentration of the second resin material is greater than the concentration of the first resin material are stacked in the light guide member 21. The first layer 12e is the solidified first resin portion 12 and contacts the transparent member 11. The second layer 16e is the cured second resin portion 16 and contacts the light-emitting element 13.

In other words, the stacked body 22 is provided in the light-emitting device 2. The pair of electrodes 14, the light-emitting element 13, the second layer 16e, the first layer 12e, and the transparent member 11 are stacked in this order upward from the bottom in the stacked body 22. The side surface of the stacked body 22 is covered with the cover member 15. However, there are also cases where the first resin material and the second resin material are somewhat mixed between the first layer 12e and the second layer 16e. In the transparent member 11, a main material 11d that is made of a transparent resin material is provided, and many fluorescer particles 11e are dispersed in the main material 11d.

In some embodiments, the resin portion on which the light-emitting element 13 is placed can be thick because the solid first resin portion 12 and the liquid second resin portion 16 are stacked on the protrusion 11a of the transparent member 11 in the process shown in FIG. 4A. Therefore, a large fluidic body of the first resin portion 12 and the second resin portion 16 is realized when the viscosity of the first resin portion 12 is reduced in the process shown in FIG. 4C. As a result, the self-alignment with respect to the light-emitting element 13 can occur more effectively, and the light-emitting element 13 can be positioned more accurately with respect to the protrusion 11a of the transparent member 11.

Small light-emitting devices are desirable in recent years. As the members such as the light-emitting element 13, the transparent member 11, etc., are downsized, there are cases where the region where the bonding agent can be provided is small. In such a case, there is a possibility that the height of the bonding agent may be low if only the bonding agent in the molten state is placed using a dispenser, etc. As a result, there is a possibility that sufficient buoyancy may not be provided to the light-emitting element 13, and self-alignment of the light-emitting element 13 may not occur easily. Although the height of the bonding agent in the molten state can be increased by increasing the viscosity of the bonding agent, coating onto a fine region is difficult. In the light-emitting device according to the embodiment, the bonding agent (the second resin portion 16) of the second layer is placed on the bonding agent (the first resin portion 12) of the first layer; thereby, the height of the entire bonding agent after melting can be increased easily, and the self-alignment of the light-emitting element 13 can occur effectively. In other words, the thicknesses of the first resin portion 12 and the second resin portion 16 can be thin while ensuring the necessary self-alignment capability.

Also, the unintended movement of the light-emitting element 13 can be suppressed by placing the liquid second resin portion 16 and by placing the light-emitting element 13 on the liquid second resin portion 16. In other words, the light-emitting element 13 can be temporarily fixed at the appropriate position by the second resin portion 16 before the heating process.

The second resin portion 16 can be cured by increasing the temperature of the structure body 17 to T2 in the process shown in FIG. 5A. Subsequently, the first resin portion 12 can be solidified by cooling the structure body 17 to the reference temperature T0 in the process shown in FIG. 5B. Thereby, the entire light-emitting device 2 can be solidified, and the mechanical strength can be guaranteed.

Third Embodiment

FIG. 8A to FIG. 10B are cross-sectional views showing a method for manufacturing a light-emitting device according to another embodiment.

The temperature profile of the heat treatment in the embodiment is similar to the profile shown in FIG. 3.

Figure 8A:
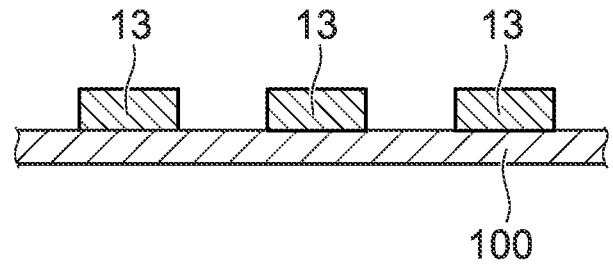
FIG. 8A is a cross-sectional view showing a method for manufacturing a light-emitting device according to a third embodiment.

First, the light-emitting element 13 is provided as shown in FIG. 8A. The light-emitting element 13 is, for example, a light-emitting diode (LED). For example, the light-emitting element 13 has a rectangular chip configuration. A pair of electrodes is provided at one surface of the light-emitting element 13. The light-emitting element 13 may be provided by manufacturing or by procuring. In the embodiment, for example, multiple light-emitting elements 13 are placed on a substrate 100.

Figure 8B:
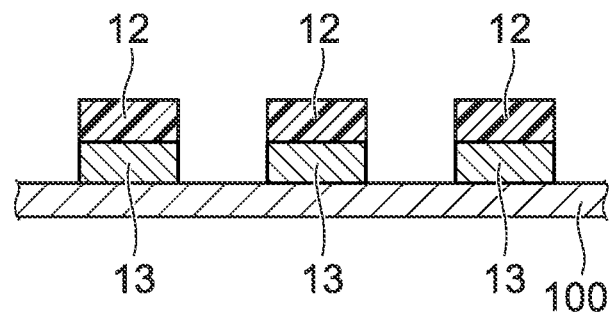
FIG. 8B is a cross-sectional view showing the method for manufacturing the light-emitting device according to the third embodiment.

Then, as shown in FIG. 8B, the solid first resin portion 12 is placed on the light-emitting element 13. As described above, "solid" also includes gels. Similarly to the first embodiment, the first resin portion 12 is made of the first resin material of which the viscosity decreases when heated. The first resin material is, for example, plastic. In an example, the first resin material is an acrylic resin.

Figure 8C:
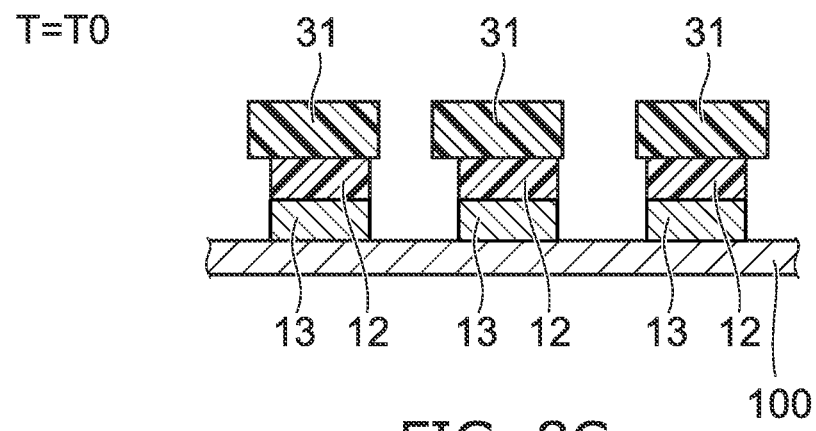
FIG. 8C is a cross-sectional view showing the method for manufacturing the light-emitting device according to the third embodiment.

Continuing as shown in FIG. 8C, transparent members 31 are placed on the first resin portions 12. Specifically, the transparent members 31 are placed one at a time on the light-emitting elements 13 with the first resin portions 12 interposed. The transparent member 31 is, for example, a fluorescer layer in which many fluorescer particles are dispersed in a main material made of a transparent resin material. The transparent member 31 may be a transparent layer not including fluorescer particles. When viewed in top-view, the transparent member 31 has a configuration similar to the configuration of the light-emitting element 13, e.g., a rectangular plate configuration.

Figure 9A:
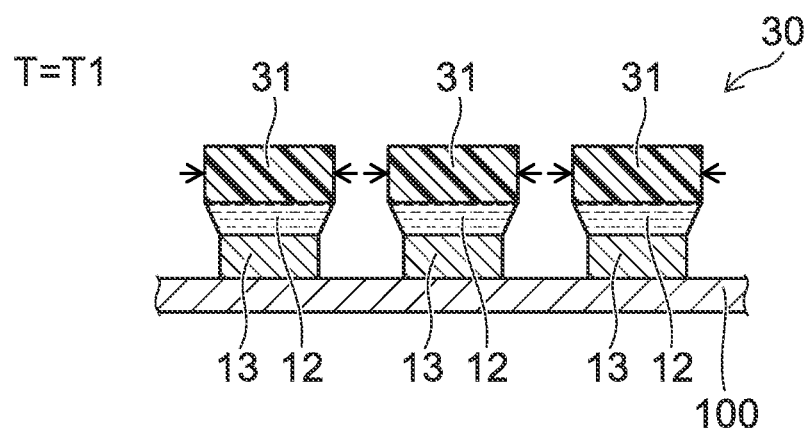
FIG. 9A is a cross-sectional view showing the method for manufacturing the light-emitting device according to the third embodiment.

Then, as shown in FIG. 9A and FIG. 3, the viscosity of the first resin portion 12 is reduced by heating a structure body 30 that includes the substrate 100, the light-emitting element 13, the first resin portion 12, and the transparent member 31 from the reference temperature T0 to the first temperature T1. The first temperature T1 is the temperature at which the viscosity of the first resin material of the first resin portion 12 decreases.

Thereby, the fluidity of the first resin portion 12 increases, and self-alignment of the transparent member 31 with respect to the light-emitting element 13 occurs. As a result, when viewed in top-view, the position and the orientation of the transparent member 31 substantially match the position and the orientation of the light-emitting element 13. In other words, when viewed in top-view, the center of the transparent member 31 substantially matches the center of the light-emitting element 13, and the edges of the transparent member 31 are substantially parallel to the edges of the light-emitting element 13.

Figure 9B:
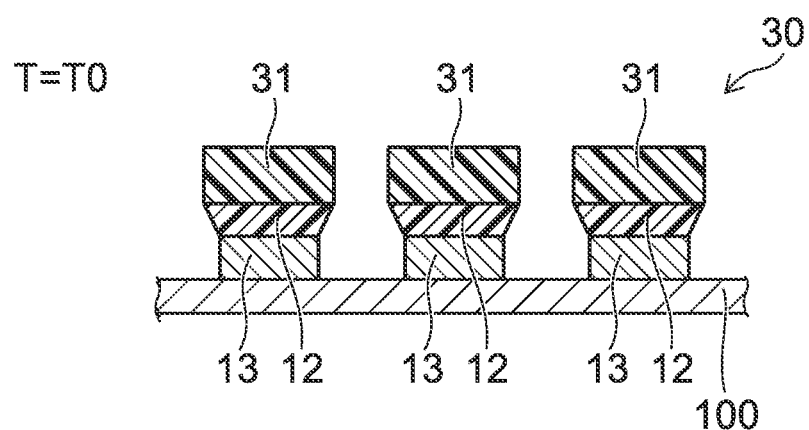
FIG. 9B is a cross-sectional view showing the method for manufacturing the light-emitting device according to the third embodiment.

Then, as shown in FIG. 9B and FIG. 3, the structure body 30 is cooled from the first temperature T1 to the reference temperature T0. The first resin portion 12 is solidified thereby. As a result, the transparent member 31 is bonded to the light-emitting element 13 by the first resin portion 12.

Figure 10A:
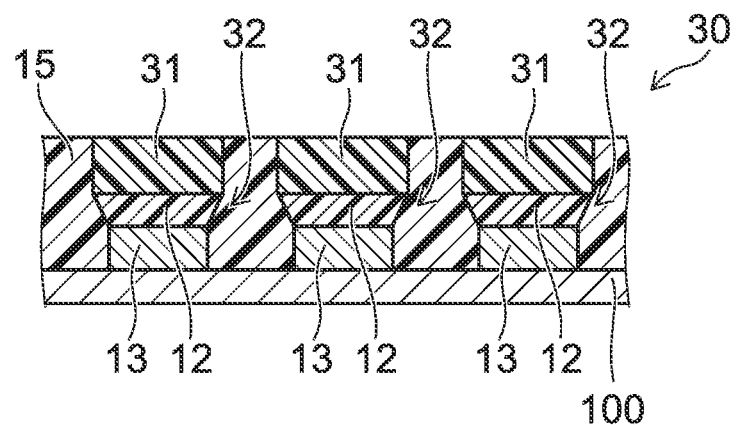
FIG. 10A is a cross-sectional view showing the method for manufacturing the light-emitting device according to the third embodiment.

Continuing as shown in FIG. 10A, the cover member 15 is formed on the substrate 100. The cover member 15 covers the side surface of a stacked body 32 made of the light-emitting element 13, the first resin portion 12, and the transparent member 31. For example, the cover member 15 is formed of a white resin material.

Figure 10B:
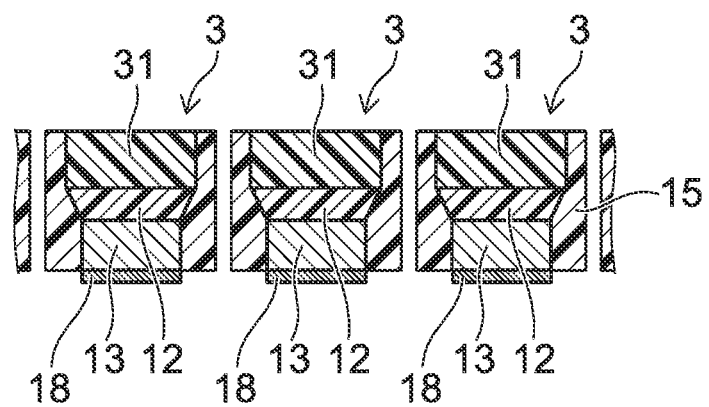
FIG. 10B is a cross-sectional view showing the method for manufacturing the light-emitting device according to the third embodiment.

Then, the substrate 100 is removed as shown in FIG. 10B. Then, a pair of conductive films 18 is formed at the lower surfaces of the electrodes of each light-emitting element 13. Then, the cover member 15 is singulated for each light-emitting element 13. Thus, the light-emitting device 3 according to the embodiment is manufactured.

In some embodiments, the first resin portion 12 can be thick because the first resin portion 12 is solid when placing the first resin portion 12 on the light-emitting element 13 in the process shown in FIG. 8B. Also, it is easy to place the transparent member 31 on the first resin portion 12 in the process shown in FIG. 8C because the first resin portion 12 is solid.

Then, the viscosity of the first resin portion 12 is reduced by heating the first resin portion 12 to the first temperature T1 in the process shown in FIG. 9A. Thereby, self-alignment of the transparent member 31 with respect to the light-emitting element 13 occurs, and the position and the orientation of the transparent member 31 substantially match the position and the orientation of the light-emitting element 13 when viewed in top-view. As a result, the shape precision of the light-emitting device 3 increases. In other words, it is unnecessary for the position and the orientation of the transparent member 31 to strictly match the position and the orientation of the light-emitting element 13 when placing the transparent member 31 in the process shown in FIG. 8C. Therefore, the process of placing the transparent member 31 on the first resin portion 12 is easy.

Fourth Embodiment

FIG. 11A to FIG. 13B are cross-sectional views showing a method for manufacturing a light-emitting device according to another embodiment.

The profile of the thermal history of the embodiment is similar to the profile shown in FIG. 6.

First, the processes shown in FIG. 8A and FIG. 8B are performed.

Figure 11A:
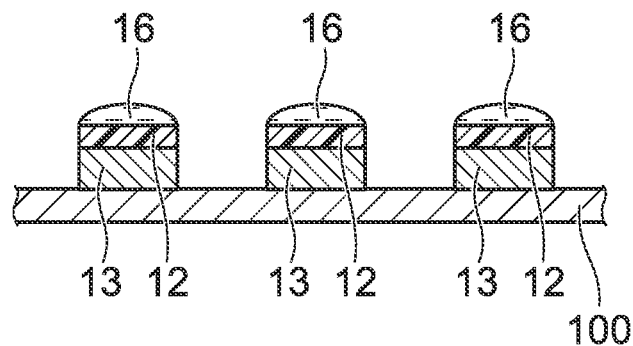
FIG. 11A is a cross-sectional view showing a method for manufacturing a light-emitting device according to a fourth embodiment.

Then, as shown in FIG. 11A, the liquid second resin portion 16 is placed on the solid first resin portion 12. As described above, "liquid" also includes sols. The second resin portion 16 is made of the thermosettable second resin material. In an example, the second resin material is a silicone resin or an epoxy resin.

Figure 11B:
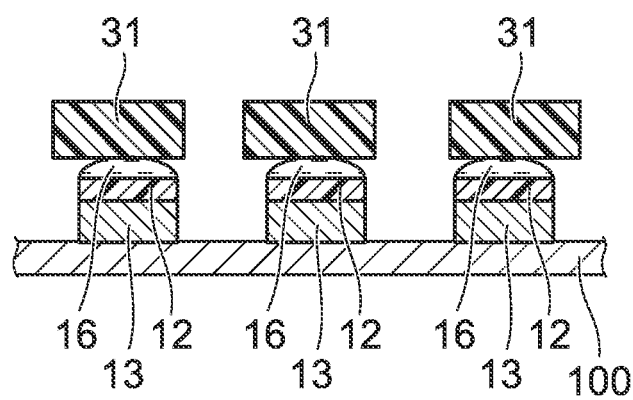
FIG. 11B is a cross-sectional view showing the method for manufacturing the light-emitting device according to the fourth embodiment.

Then, as shown in FIG. 11B, the transparent member 31 is placed on the second resin portion 16. As described in the third embodiment, the transparent member 31 is, for example, a fluorescer layer including fluorescer particles or a transparent layer not including fluorescer particles.

Specifically, the transparent members 31 are placed one at a time on the light-emitting elements 13 with the solid first resin portions 12 and the liquid second resin portions 16 interposed. When placing the transparent member 31 on the second resin portion 16, the position and the orientation of the transparent member 31 may be the same as the position and the orientation of the light-emitting element 13 or may be shifted from the position and the orientation of the light-emitting element 13 when viewed in top-view.

Figure 11C:
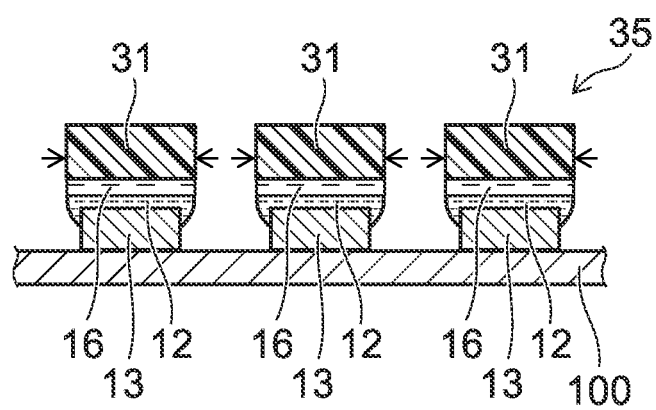
FIG. 11C is a cross-sectional view showing the method for manufacturing the light-emitting device according to the fourth embodiment.

Then, as shown in FIG. 11C and FIG. 6, the viscosity of the first resin portion 12 is reduced by heating a structure body 35 including the substrate 100, the light-emitting element 13, the first resin portion 12, the second resin portion 16, and the transparent member 31 from the reference temperature T0 to the first temperature T1. The first temperature T1 is the temperature at which the viscosity of the first resin material of the first resin portion 12 decreases.

Thereby, the fluidity of the first resin portion 12 increases, and the first resin portion 12 becomes a large fluidic body with the liquid second resin portion 16. Therefore, self-alignment of the transparent member 31 with respect to the light-emitting element 13 occurs. As a result, the position and the orientation of the transparent member 31 substantially match the position and the orientation of the light-emitting element 13 when viewed in top-view. In other words, when viewed in top-view, the center of the transparent member 31 substantially matches the center of the light-emitting element 13, and the edges of the transparent member 31 are substantially parallel to the edges of the light-emitting element 13.

Figure 12A:
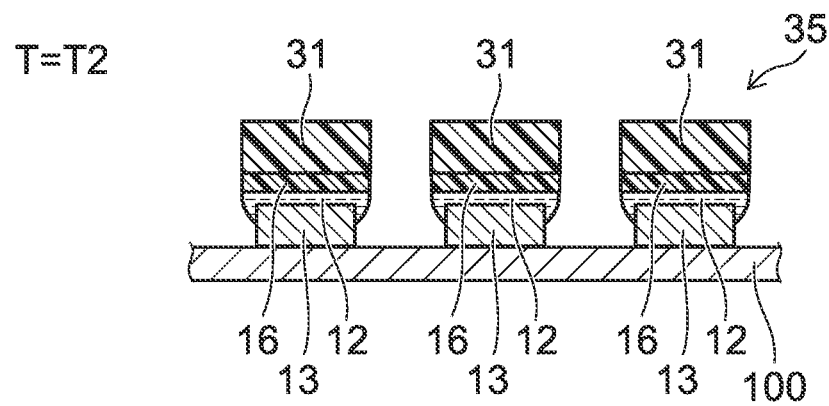
FIG. 12A is a cross-sectional view showing the method for manufacturing the light-emitting device according to the fourth embodiment.

Then, as shown in FIG. 12A and FIG. 6, the structure body 35 is heated to the second temperature T2 that is higher than the first temperature T1. The second temperature T2 is the temperature at which the second resin material cures. The second resin portion 16 is cured thereby.

Figure 12B:
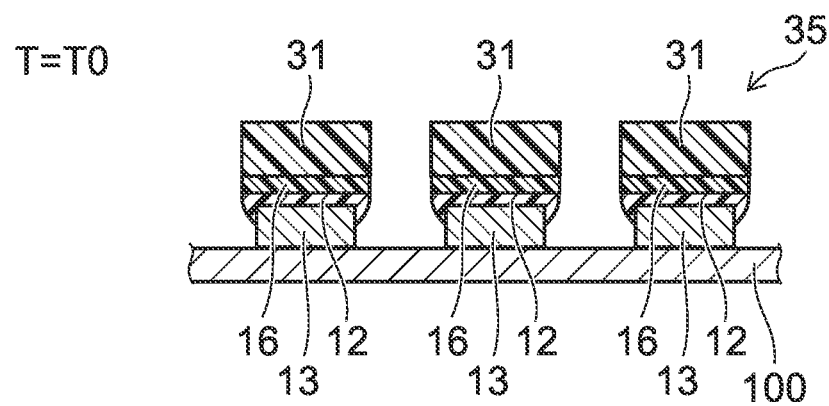
FIG. 12B is a cross-sectional view showing the method for manufacturing the light-emitting device according to the fourth embodiment.

Continuing as shown in FIG. 12B and FIG. 6, the structure body 35 is cooled from the second temperature T2 to the reference temperature T0. The first resin portion 12 is solidified thereby. As a result, the transparent member 31 is bonded to the light-emitting element 13 by the first resin portion 12 and the second resin portion 16.

Figure 13A:
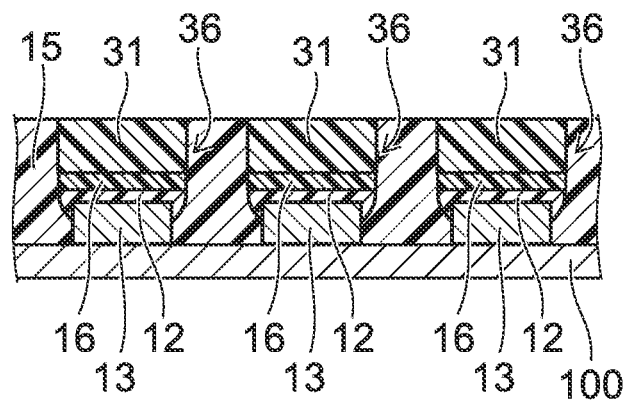
FIG. 13A is a cross-sectional view showing the method for manufacturing the light-emitting device according to the fourth embodiment.

Thereafter, the processes are similar to those of the third embodiment. In other words, as shown in FIG. 13A, the cover member 15 is formed on the substrate 100. The cover member 15 covers the side surface of a stacked body 36 made of the light-emitting element 13, the first resin portion 12, the second resin portion 16, and the transparent member 31.

Figure 13B:
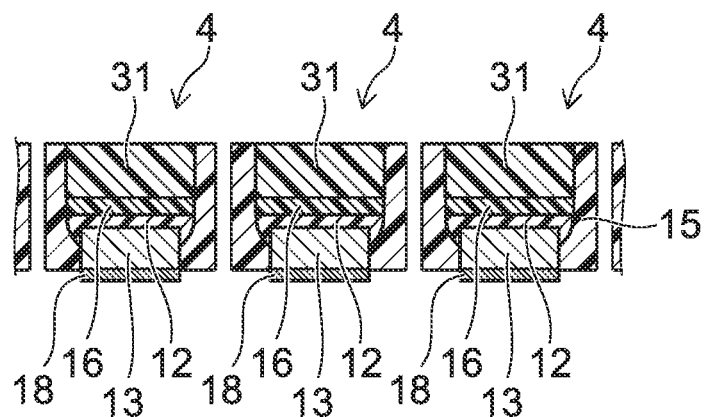
FIG. 13B is a cross-sectional view showing the method for manufacturing the light-emitting device according to the fourth embodiment.

Continuing, the substrate 100 is removed as shown in FIG. 13B. Then, the pair of conductive films 18 is formed at the lower surfaces of the electrodes of each light-emitting element 13. Then, the cover member 15 is singulated for each light-emitting element 13. Thus, the light-emitting device 4 according to the embodiment is manufactured.

The light-emitting device according to some embodiments will now be described.

Figure 14:
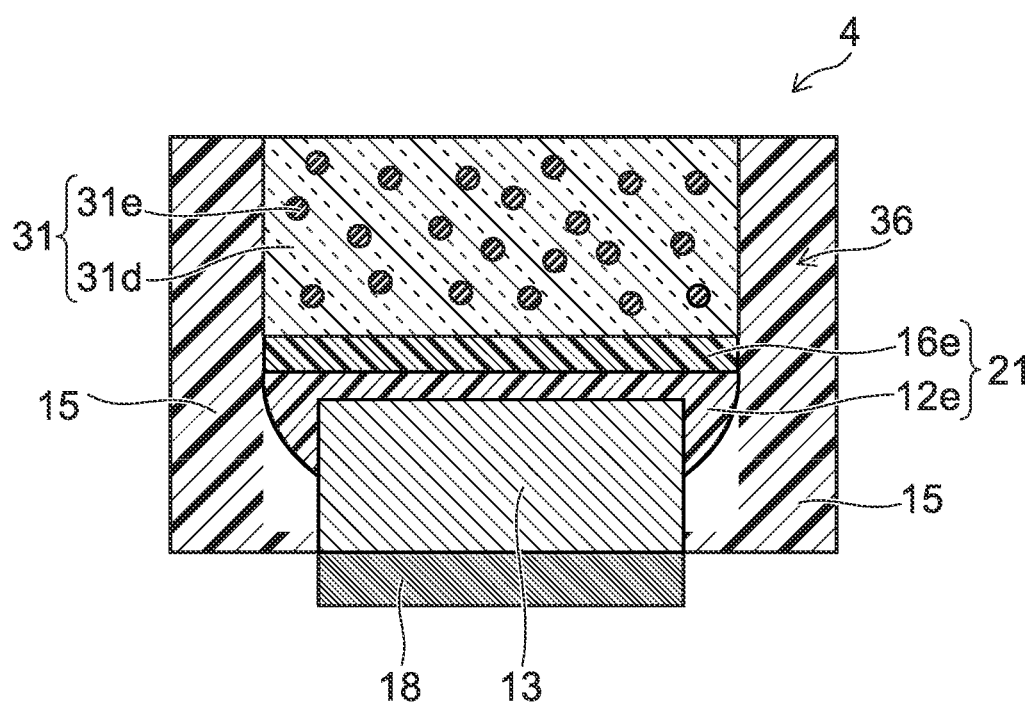
FIG. 14 is a cross-sectional view showing the light-emitting device according to the fourth embodiment.

FIG. 14 is a cross-sectional view showing the light-emitting device according to certain embodiments.

As shown in FIG. 14, the light-emitting element 13, the transparent member 31 provided on the light-emitting element 13, the light guide member 21 provided between the light-emitting element 13 and the transparent member 31, and the cover member 15 are provided in the light-emitting device 4 according to some embodiments. The cover member 15 covers the side surface of the stacked body 36 including the light-emitting element 13, the light guide member 21, and the transparent member 31.

The light guide member 21 covers the upper surface of the light-emitting element 13, the side surface of the light-emitting element 13, and the lower surface of the transparent member 31. The light guide member 21 includes the thermosettable second resin material and the first resin material of which the viscosity decreases when heated. The first resin material is, for example, thermoplastic, e.g., an acrylic resin. The second resin material is, for example, a silicone resin or an epoxy resin.

The first layer 12e in which the concentration of the first resin material is greater than the concentration of the second resin material and the second layer 16e in which the concentration of the second resin material is greater than the concentration of the first resin material are stacked in the light guide member 21. The first layer 12e is the solidified first resin portion 12 and contacts the light-emitting element 13. The second layer 16e is the cured second resin portion 16 and contacts the transparent member 31. However, there are also cases where the first resin material and the second resin material are somewhat mixed between the first layer 12e and the second layer 16e. In the transparent member 31, a main material 31d that is made of a transparent resin material is provided, and fluorescer particles 31e are dispersed in the main material 31d.

In some embodiments, the resin portion on which the transparent member 31 is placed can be thick because the solid first resin portion 12 and the liquid second resin portion 16 are stacked on the light-emitting element 13 in the process shown in FIG. 11A. Therefore, the first resin portion 12 and the second resin portion 16 become a large fluidic body when the viscosity of the first resin portion 12 is reduced in the process shown in FIG. 11C. As a result, sufficient buoyancy is applied to the transparent member 31; therefore, the self-alignment of the transparent member 31 can be more effective, and the transparent member 31 can be positioned more accurately with respect to the light-emitting element 13.

The second resin portion 16 is cured by increasing the temperature of the structure body 35 to T2 in the process shown in FIG. 12A. Subsequently, the first resin portion 12 is solidified by cooling the structure body 35 to the reference temperature T0 in the process shown in FIG. 12B. Thereby, the entire light-emitting device 4 can be solidified, and the mechanical strength can be guaranteed.

Specific examples of the members that are used in the method for manufacturing the light-emitting device according to some embodiments will now be described.

Light-Emitting Element

The light-emitting element 13 is, for example, an LED chip. For example, the light-emitting element 13 may have a semiconductor stacked structure including a nitride semiconductor ($In_xAl_yGa_{1-x-y}N$, $0 \le x$, $0 \le y$, and $x+y \le 1$) capable of light emission in ultraviolet to the visible region. Considering the luminous efficiency of the light-emitting device, the excitation spectrum of the fluorescer, color mixing, etc., it is favorable for the light emission peak wavelength of the light-emitting element 13 to be not less than 400 nm and not more than 530 nm, more favorably not less than 420 nm and not more than 490 nm, and more favorably not less than 450 nm and not more than 475 nm. One, two, or more light-emitting elements 13 may be included in the light-emitting device. It is favorable for the width at half maximum of the light-emitting element 13 to be 40 nm or less, and more favorably 30 nm or less. Thereby, the light that is emitted from the light-emitting element 13 easily can have a sharp peak. As a result, for example, when the light-emitting device is used as the light source of a liquid crystal display device or the like, high color reproducibility of the liquid crystal display device can be achieved. The electrical connections of the multiple light-emitting elements can be in series, in parallel, or a connection method combining series and parallel.

In some embodiments, the planar configuration of the light-emitting element 13 can be a square or a rectangle that is long in one direction. Also, the planar configuration of the light-emitting element 13 may be a hexagon or other polygon. A pair of positive and negative electrodes 14 is connected to the light-emitting element 13. The positive and negative electrodes can include gold, silver, copper, tin, platinum, rhodium, titanium, aluminum, tungsten, palladium, nickel, or an alloy of these metals. The side surface of the light-emitting element 13 may be perpendicular to the upper surface of the light-emitting element 13 or may be oblique inward or outward.

Transparent Member

The main materials 11d and 31d of the transparent members 11 and 31 are transparent to the light emitted by the light-emitting element 13. In the specification, "transparent" refers to the light transmittance for the light emission peak wavelength of the light-emitting element 13 being 60% or more, favorably 70% or more, and more favorably 80% or more. For example, the main material of the transparent members 11 and 31 can be a silicone resin, an epoxy resin, a phenol resin, a polycarbonate resin, an acrylic resin, or a modified resin of these resins. In particular, a silicone resin and an epoxy resin are used favorably due to excellent heat resistance and lightfastness. A dimethyl silicone resin, a phenyl-methyl silicone resin, a diphenyl silicone resin, etc., are examples of the silicone resin.

The transparent members 11 and 31 may include light-diffusing particles. Silicon oxide, aluminum oxide, zirconium oxide, zinc oxide, etc., are examples of light-diffusing particles. One type of the light-diffusing particles can be used solitarily, or two or more types can be used in combination. In particular, it is favorable for silicon oxide which has a small linear expansion coefficient to be used as the light-diffusing particles. It is also favorable for nanoparticles to be used as the light-diffusing particles. Thereby, the scattering of the light emitted by the light-emitting element can be increased, and the usage of the fluorescer can be reduced. "Nanoparticle" refers to a particle having a particle size not less than 1 nm and not more than 100 nm. In the specification, the particle size is defined mainly using D50.

The transparent members 11 and 31 may include the fluorescer particles 11e and 31e. The fluorescer particles 11e and 31e are members absorbing at least a portion of the primary light emitted by the light-emitting element 13 and emitting secondary light of a wavelength different from that of the primary light. The fluorescer particle can be one type of the fluorescers described below formed solitarily or can be formed as a combination of two or more types.

Examples of the fluorescer include an yttrium-aluminum-garnet-based fluorescer (e.g., $Y_3(Al, Ga)_5O_{12}$:Ce), a lutetium-aluminum-garnet-based fluorescer (e.g., $Lu_3(Al, Ga)_5O_{12}$:Ce), a terbium-aluminum-garnet-based fluorescer (e.g., $Tb_3(Al, Ga)_5O_{12}$:Ce), a silicate-based fluorescer (e.g., $(Ba, Sr)_2SiO_4$:Eu), a chlorosilicate-based fluorescer (e.g., $Ca_8Mg(SiO_4)_4Cl_2$:Eu), a β-sialon-based fluorescer (e.g., $Si_{6-z}Al_zO_zN_{8-z}$:Eu (0<z<4.2)), a SGS-based fluorescer (e.g., $SrGa_2S_4$:Eu), an alkaline earth aluminate-based fluorescer (e.g., $(Ba, Sr, Ca)Mg_xAl_{10}O_{17-x}$:Eu, Mn), an α-sialon-based fluorescer (e.g., $Mz(Si, Al)_{12}(O, N)_{16}$ (0<z≤2, and M being a lanthanide element other than Li, Mg, Ca, Y, La, and Ce)), a nitrogen-including calcium aluminosilicate-based fluorescer (e.g., $(Sr, Ca)AlSiN_3$:Eu), and a manganese-activated fluoride-based fluorescer (a fluorescer represented by general formula (I) of $A_2[M_{1-a}Mn_aF_6]$ (in general formula (I) recited above, A being at least one selected from the group consisting of K, Li, Na, Rb, Cs, and $NH_4$, M being at least one type of element selected from the group consisting of a Group 4 element and a Group 14 element, and a satisfying 0<a<0.2)). The light emission peak wavelength of the yttrium-aluminum-garnet-based fluorescer can be shifted to the longer-wavelength side by replacing a portion of Y with Gd. A typical example of the manganese-activated fluoride-based fluorescer is a fluorescer of manganese-activated potassium fluorosilicate (e.g., $K_2SiF_6$:Mn).

For example, the invention can be utilized in a lighting device, the light source of a display device, etc.

What is claimed is:

1. A method for manufacturing a light-emitting device, said method comprising:
   providing a transparent member having a protrusion formed at an upper surface of the transparent member, the transparent member including a fluorescer particle;
   placing a first resin portion on the protrusion, the first resin portion having a solid form and being made from a first resin material, wherein a viscosity of the first resin material decreases when heated;
   placing a light-emitting element on the first resin portion;
   causing self-alignment of the light-emitting element with respect to the protrusion by reducing a viscosity of the first resin portion by heating to a first temperature; and
   solidifying the first resin portion by cooling.

2. The method according to claim 1, further comprising:
   placing a second resin portion on the first resin portion, the second resin portion being in a liquid form and comprising a second resin material, the second resin material being thermosettable; and
   after the self-alignment, curing the second resin portion by heating to a second temperature higher than the first temperature,
   the light-emitting element being placed on the second resin portion in the placing of the light-emitting element.

3. The method according to claim 1, wherein the first resin material is thermoplastic.

* * * * *